United States Patent [19]

Bradley

[11] Patent Number: 5,111,467
[45] Date of Patent: * May 5, 1992

[54] HYBRID RUGATE FILTER ASSEMBLY FOR TEMPERATURE STABILIZED EMISSION OF GRATING COUPLED SURFACE EMITTING LASERS

[75] Inventor: Eric M. Bradley, San Diego, Calif.

[73] Assignee: Tacan Corporation, Carlsbad, Calif.

[*] Notice: The portion of the term of this patent subsequent to Apr. 28, 2009 has been disclaimed.

[21] Appl. No.: 579,602

[22] Filed: Sep. 10, 1990

[51] Int. Cl.$^5$ .............................................. H01S 3/10
[52] U.S. Cl. ....................................... 372/32; 372/49; 372/50; 372/96
[58] Field of Search ................... 372/49, 96, 50, 45, 372/29, 32, 23

[56] References Cited

U.S. PATENT DOCUMENTS

| | | | |
|---|---|---|---|
| 4,872,176 | 10/1989 | Hammer | 372/50 |
| 4,894,833 | 1/1990 | Carlin | 372/50 |
| 4,951,292 | 8/1990 | Kuindersma et al. | 372/49 |
| 4,952,019 | 8/1990 | Evans et al. | 372/49 |

OTHER PUBLICATIONS

"Monolithically-Integrated Hybrid Heterostructure Diode Laser with Dielectric Film Waveguide DBR", Zh. I. Alferov et al., *IEEE J. of Quant. Elec.*, vol. QE-23, No. 6, Jun. 1987, pp. 869-881.
"Testing of a Bragg Heterojunction Injection Laser with a Thermally Stable Output Wavelength", S. A. Gurevich, *Sov. Tech. Phys. Lett.*, 11(5) May 1985, pp. 218-220.

*Primary Examiner*—James W. Davie
*Attorney, Agent, or Firm*—Brown, Martin, Haller & McClain

[57] ABSTRACT

A dielectric film is deposited on a glass substrate which is transparent to the emission wavelength of a grating coupled surface emitting laser. The dielectric film has a continuously varying refractive index with thickness, usually in the form of a sine wave. The rugate filter is assembled to overlie the second order grating of the laser so that a peak wavelength $\lambda_p$ is reflected back into the second order grating which couples the light into the laser. By reflecting light at the peak wavelength back into the laser, the laser is caused to emit at the desired wavelength. Since the rugate filter selectively reflects light within a narrow band of the desired wavelength, the laser emits light within the same narrow band which can be set to any wavelength by choosing the rugate filter's grating period. The use of a rugate filter separately assembled from the laser permits the creation of a matrix of filters, each filter fabricated to select a discrete wavelength so that a single array of surface emitting lasers can emit at multiple distinct stabilized wavelengths according to the filters in the matrix.

9 Claims, 1 Drawing Sheet

HYBRID RUGATE FILTER ASSEMBLY FOR TEMPERATURE STABILIZED EMISSION OF GRATING COUPLED SURFACE EMITTING LASERS

BACKGROUND OF THE INVENTION

I. Field of the Invention

The present invention relates to semiconductor lasers. More particularly, the present invention relates to a surface emitting laser assembly for high power, temperature stabilized wavelength operation.

II. Background Art

Conventional semiconductor lasers are configured for emitting light from an edge-cleaved facet of the device. Surface emitting lasers, which emit light from a top or bottom surface of the device, have an advantage over conventional edge emitting lasers in that the surface emitting lasers are readily adaptable for coupling to other optical components. The monolithic nature of the surface emitting laser structure also provides considerable advantages over hybrid devices in the way of mechanical and thermal stability. Surface emitting lasers also make possible large emitting areas which can be made to have narrow beam angles and high power outputs.

Grating coupled surface emitting lasers (GCSEL) have gratings etched into waveguides adjacent to the active region which effect feedback and coupling out of the laser emission. Grating coupled surface emitting lasers have an advantage over vertical cavity surface emitting lasers (VCSELs) in that fabrication of a multilayer semiconductor mirror directly on the laser chip to achieve vertical light propagation (i.e., surface emission) creates a risk of defect centers in the laser due to the excessively thick growths necessary for high reflectance mirrors and often requires specially constructed electrodes.

Distributed Bragg reflector lasers are among the best wavelength stabilized diode lasers available today. According to the Bragg reflection principle, refractive index variations and thickness of the layers are chosen so that partial reflections interfere constructively at a narrow band of wavelengths but not at wavelengths outside the band. Light within the selected narrow band is coupled back into the laser active area enhancing single longitudinal mode operation, or multi-longitudinal mode operation with the modes restricted to lie within the bandwidth of the distributed Bragg reflector's reflection peak.

It is known that thermally-stabilized conventional DBR lasers may be constructed with layers of dielectrics possessing approximately equal and opposite changes in refractive index, see S. A. Gurevich, et al., Sov. Tech. Phys. Lett. 11(5), May, 1985 and Zh. I. Alferov, et al., IEEE Journal of Quantum Electronics, Vol. QE-23, No. 6, Jun., 1987. In a commonly assigned co-pending application (Ser. No. 07/458,155), U.S. Pat. No. 5,043,991 the inventor discloses a method of stabilizing temperature-induced emission wavelength fluctuation in diode lasers by assembling a conventional Fabry-Perot laser together with a temperature-stabilized corrugated waveguide.

In another commonly assigned co-pending application (Ser. No. 07/579,933), U.S. Pat. No 5,056,099 the inventor describes a rugate filter for temperature stabilization of emission wavelengths of a conventional Fabry-Perot laser. The rugate filter comprises a dielectric film having a refractive index which varies in an approximately sinusoidal fashion throughout its thickness. The filter acts much like the Bragg grating described above. The dielectric film consists of a glass with a refractive index which does not vary with temperature by more than $10^{-6}/°C$.

In a third commonly assigned co-pending application (Ser. No. 07/579,597) the inventor discloses a rugate filter deposited on the second order grating of a grating coupled surface emitting laser for temperature stabilized laser emission at a desired wavelength. Such a device has the advantages of monolithic configuration but the disadvantages of exposure of the laser chip to additional steps in the fabrication process and considerable difficulty in creating lasers capable of operating at multiple center wavelengths on a single array.

It would be desirable to provide a filter for temperature stabilizing the emission wavelength of a grating coupled surface emitting laser which permits exploitation of the positive aspects of surface emitting lasers without exposure of the laser chip to additional processing, and which allows a single array of lasers to simultaneously emit light at multiple discrete wavelengths while maintaining stabilization of each wavelength. It is to this objective that the present invention is directed.

SUMMARY OF THE INVENTION

It is an advantage of the present invention to provide a device and method of temperature stabilization of the emission wavelength of grating coupled surface emitting lasers using a hybrid assembly with rugate filters.

It is a further advantage of the present invention to provide a device for causing a surface emitting laser array to emit light at a plurality of discrete wavelengths which are temperature stabilized against shifts in the center wavelength.

In an exemplary embodiment, the rugate filter comprises a dielectric film deposited over a glass substrate which is transparent to a range of wavelengths around the desired wavelength. The dielectric film has a continuously varying refractive index with thickness, usually in the form of a sine wave. Such a film may be deposited by ion-assisted co-deposition techniques in which the concentration of the higher refractive index dielectric is periodically varied according to the period required to produce the desired filter. The dielectric of which the rugate filter is formed has a refractive index which does not vary with temperature by more than $10^{-6}/°C$. This is achieved by depositing a film comprising, for example, $(SiO_2)_x (Ta_2O_5)_{1-x}$, each component of which has an approximately equal and opposite index-temperature coefficient to the other, so that the net change in refractive index of the film with temperature is as close to zero as possible.

The rugate filter is a sophisticated version of a Bragg grating. The filter reflects a peak wavelength $\lambda_p$ back into the second order grating on the laser chip. The light is then coupled into the laser by the second order grating according to the equation $\lambda_p = 2n_{eff}\Lambda$, where $\Lambda$ is the period of the sinusoidal variation of refractive index. By reflecting light at the peak wavelength back into the laser, the laser is caused to emit at the desired wavelength. Since the rugate filter selectively reflects light within a narrow band of the desired wavelength, the laser emits light within the same narrow band.

An array of grating coupled surface emitting lasers may be made to emit light at several discrete wavelengths by assembling the laser array with a matrix of rugate filters in which each filter has a period corresponding to one of the desired wavelengths. The different period of each rugate filter will cause its corresponding laser to emit at its chosen wavelength, independent of emission wavelengths of other lasers in the array.

BRIEF DESCRIPTION OF THE DRAWINGS

Understanding of the present invention will be facilitated by the consideration of the following detailed description of a preferred embodiment of the present invention, taken in conjunction with the accompanying drawings, in which like reference numerals refer to like parts and in which.

DETAILED DESCRIPTION OF THE PREFERRED EMBODIMENT

Figure 1:
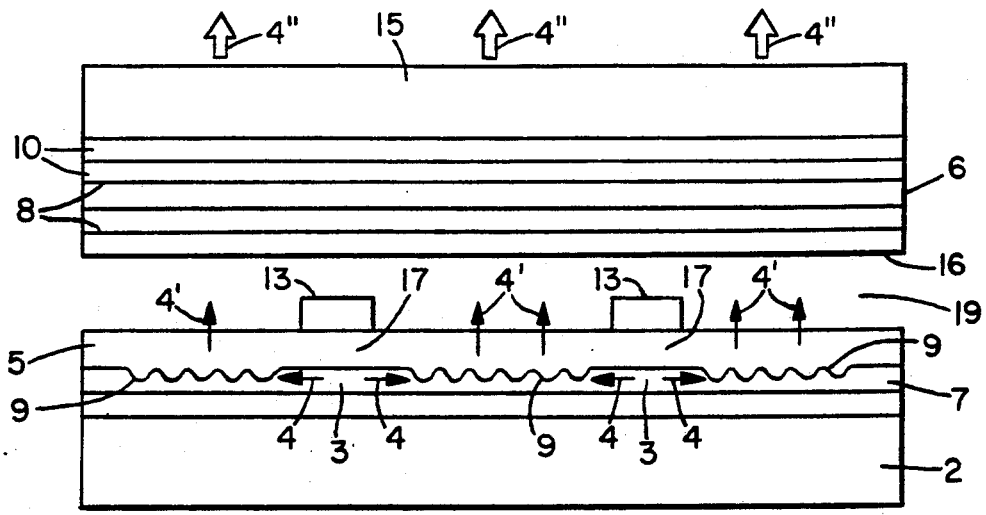
FIG. 1 is a diagrammatic side view of a grating coupled surface emitting laser with rugate filters according to the present invention.

As shown in FIG. 1, a grating coupled surface emitting laser comprises a substrate 2 and a waveguide layer 7 in which the active region 3 and corrugated gratings 9 are located. Assembled so that it is overlying the corrugated grating 9 of waveguide layer 7 is a rugate filter 6 on substrate 15. Current is provided to the laser by electrode—.

Rugate filter 6 is a dielectric or glass film which has a continuously varying refractive index, usually in the form of a sine wave. The variation of refractive index occurs with a period which is determined according to the equation $\Lambda = \lambda/2n_{av}$ where $\Lambda$ is the peak-to-peak spacing of the refractive index period, $n_{av}$ is the average refractive index, and $\lambda$ is the desired emission wavelength. The difference between the maximum refractive index 8 and the minimum refractive index 10 and the total number of periods of the sinusoidal variation are determinant of the degree of reflection; the greater the index difference or number of periods, the greater the reflection.

The film of which the rugate filter 6 is comprised is preferably a co-deposited film of $SiO_2$ and $Ta_2O_5$. These two materials have approximately equal and opposite changes in refractive index with temperature (index-temperature coefficient), so that the net change with temperature is very small, on the order of $10^{-6}/°C$.

Refractive index variation in the rugate filter is produced by varying the ratio of $SiO_2$ to $Ta_2O_5$, according to the formula $(SiO_2)_x (Ta_2O_5)_{1-x}$. An increase in the concentration of $Ta_2O_5$, which has a refractive index on the order of 2.1 compared to 1.45 for $SiO_2$, results in an increase of the refractive index of the bulk film. The variation of the ratio of $SiO_2$ to $Ta_2O_5$ during deposition will occur at the same frequency as the refractive index variation for the chosen wavelength. As an illustration, a desired center wavelength of 865 nm would require a refractive index variation of approximately 2,444 Å, so at a film deposition rate of 1,000 Å per minute, the ratio of $SiO_2$ to $Ta_2O_5$ will need to be varied in cycles of approximately 2.44 minutes.

Figure 2:
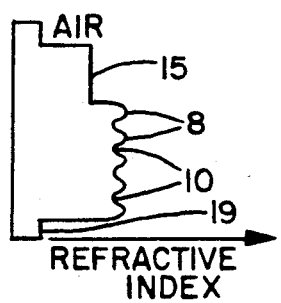
FIG. 2 is a graph of refractive index variation taken along a line running through the filter parallel to the light path.

FIG. 2 illustrates the relative refractive indices of air, the filter 6, and the substrate 15 taken on a vertical line through the upper portion of FIG. 1. The variation within filter 6 is sinusoidal, where maximum refractive index 8 ($n_{max}$) is potentially as high as 2.1, and minimum refractive index 10 ($n_{min}$) may be as low as 1.45.

In the preferred embodiment, the grating coupled surface emitting laser is fabricated by growing alternately doped epitaxial layers of semiconductor material such as GaAlAs to form one or more diodes. In the semiconductor layer which acts as waveguide layer 7, using appropriate photolithography techniques, a grating 9 is etched into a portion of the layer 7 on both sides of the active region 3. A lower refractive index layer 5 comprising either dielectric semiconductor or air serves as the upper cladding layer. The grating portion 9 of the waveguide 7 is a second order grating with the function of coupling light emitted from the active region 3 vertically out of the device following the paths 4 and 4'.

Rugate filter 6 is assembled with the laser chip so that it is directly over the second order grating and reflects light 4' of a selected wavelength back into the second order grating which then directs the reflected light back into the active region 3. The peak-to-peak spacing $\Lambda$ of the variations in refractive index of the rugate filter 6 "selects" a wavelength by creating constructive interference at a narrow band around that wavelength but not at other wavelengths. The reflection of light 4' at that wavelength back into the cavity will cause the laser to prefer to lase at that wavelength. Output light 4" is taken on the upper side of filter 6 or can be taken through the substrate 2 if the substrate 2 is transparent to the emission wavelength.

The substrate 15 is of a glass or other material which is transparent at the emission wavelength. The method of depositing the dielectric film on the substrate 15 is preferably ion-assisted deposition, which involves the bombardment of the growing film with ions which break down the columnar structure which normally forms during deposition of refractory oxides such as $SiO_2$ and $Ta_2O_5$, thereby creating a nearly amorphous film. Adhesion is greatly improved by using the ion gun to sputter the substrate surface immediately prior to deposition. Ion-assisted deposited films exhibit reduced index variations, primarily because the increased density significantly reduces the amount of water absorbed by the film.

After fabrication of the rugate filter 6 it is assembled with the laser chip so that it overlies the second order grating. The combination of the rugate filter 6 and substrate 15 may be oriented with the rugate filter either on the bottom or on top relative to the substrate 15 as long as substrate 15 consists of a material which is transparent to the emission wavelength. It is desirable to deposit an anti-reflection coating on the bottom surface 16 to prevent excessive losses to reflection within the gap 19 between the rugate filter and the second order grating.

The deposition of a rugate filter on a separate substrate which is assembled with the grating coupled surface emitting laser has the advantage that 1) additional processing which may impact the yield, performance and lifetime of the laser is avoided; 2) large arrays of such lasers are relatively easy to fabricate; and 3) the divergence angle of the light emitted vertically from the second order grating can be much less than that of a conventional edge emitting diode laser since the emitting area of the grating coupled surface emitting laser can be much larger than is possible with an edge emitting diode laser. A comparison may be made with a device described in a commonly assigned co-pending application (Ser. No. 07/579,933), U.S. Pat. No. 5,056,099 which has a rugate filter deposited on the cleaved facet of an edge emitting laser. This narrower divergence angle makes it possible for the rugate filter to exhibit a much narrower reflection peak based upon the reasoning that if the light is incident on the rugate filter at a wide range of angles, the light at each different angle perceives the center frequency of the filter to be at a different wavelength. This effectively broadens the reflection peak of the rugate filter. Even if the light incident on a grating is collimated to such an extent that the shift in center frequency with incident angle is insignificant, it is necessary for the light to penetrate into the grating to a depth d given approximately by $\Delta\lambda/\lambda_0 = \lambda_0/d$ where $\Delta\lambda$ is the width of the reflection peak and $\lambda_0$ is the center wavelength. This expresses a Fourier transform relationship between the depth of penetration d and the spectral width $\Delta\lambda$. The result is that for narrower reflection peaks, the light must penetrate deeply into the grating. If the light emerging from the facet of an edge emitting laser is diverging at a high angle and must penetrate up to 1 mm or even 1 cm into the grating, when the light returns to the laser it will not re-enter the waveguide from which it came. The result is that only a very small portion of the light which penetrates far enough into the grating to produce the desired result (i.e., narrow band reflection) will actually reenter the laser. Because of the relatively large emission area of grating coupled surface emitting lasers (GCSELs) and the possibility of locating arrays of GCSELs together on the same substrate, light can be coupled back into the GCSELs much more efficiently and it is therefore possible to obtain high power emission with a tightly controlled temperature stabilized emission wavelength by use of a rugate filter.

Figure 3:
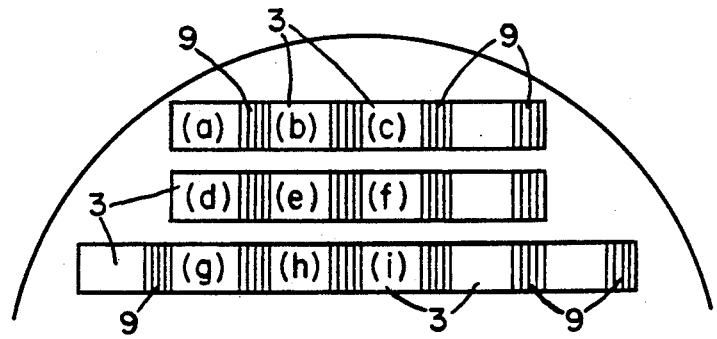
FIG. 3 is a diagrammatic top view of a wafer showing an array of grating coupled surface emitting lasers.
Figure 4:
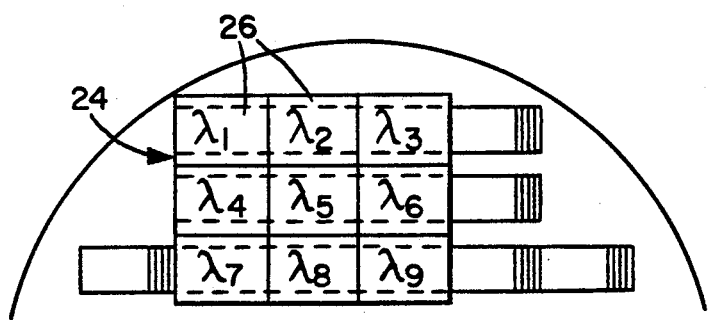
FIG. 4 is a diagrammatic top view of an array of rugate filters with different reflection peaks.

FIG. 3 illustrates several arrays of grating coupled surface emitting lasers fabricated on a single substrate 2. Each laser within the array is identical to all others. Nine such lasers are indicated by letters (a) through (i). This array can be used with a matrix of rugate filters, shown in FIG. 4, to cause emission at a number of discrete wavelengths. The matrix 24 of rugate filters, each having a reflection peak at a different wavelength, is made by separately fabricating a large rugate filter for each of the wavelengths $\lambda_1$ through $\lambda_9$ on separate substrates, then dicing the large filters into smaller squares and assembling the die 26 into matrix 24. One die for each wavelength would be assembled to overlie a portion of the surface emitting laser array to cause that portion of the laser to emit at the chosen wavelength within the range of wavelengths $\lambda_1$ through $\lambda_9$. As shown, the filter which will reflect light at $\lambda_1$ corresponds to laser (a) within the array of lasers, so that laser (a) will emit light at $\lambda_1$. The filter for $\lambda_2$ is located over laser (b) causing laser (b) to emit light at $\lambda_2$ and so on. While a matrix of nine filters is shown, any number of filters may be assembled in a matrix to correspond to an array of surface emitting lasers. Any number of lasers may be locked to a given die such as $\lambda$, and those lasers may or may not be coupled to one another through the waveguides on the surface of the laser chip. Normally the lasers locked to the die $\lambda_1$, will not be coupled to those of die $\lambda_2$.

Figure 5:
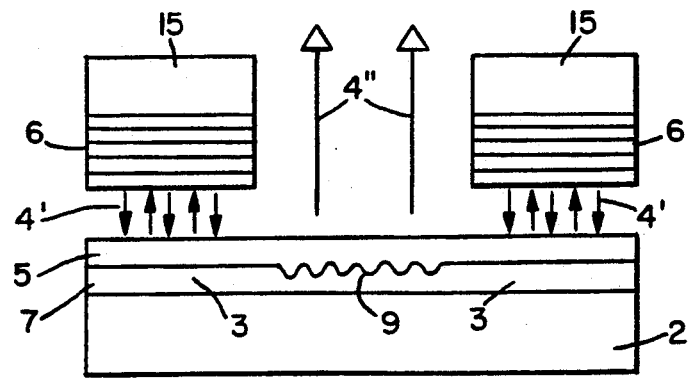
FIG. 5 is a diagrammatic side view of a second embodiment of the present invention.

In an alternate embodiment shown in FIG. 5, the rugate filter 6 may be located above the active region 3 of the laser. In this embodiment the substrate 15 need not be transparent to the emission wavelength. Output emission 4'' is taken at grating 9, separate from the wavelength stabilization loop.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. An apparatus including a filter for temperature stabilized emission at a desired wavelength by a surface emitting laser having an active region and at least one second order grating for vertical emission adjacent to said active region, said filter comprising:
   a substrate which is transparent to light of said desired wavelength; and
   a dielectric film having an average refractive index deposited on said substrate, said average refractive index having a periodic variation comprising an alternating higher and lower refractive index, said periodic variation having a period where said desired wavelength is a function of said period, said dielectric film having sufficient thickness to cover a plurality of periods whereby said filter assembled over said second order grating selectively reflects light of said desired wavelength back into said second order grating which deflects said reflected light into said active region causing said laser to emit light at said desired wavelength.

2. A filter as in claim 1 wherein each period of said plurality comprises a sinusoidal period.

3. A filter as in claim 1 wherein said film comprises a co-deposited layer of dielectrics having approximately equal and opposite index-temperature coefficients.

4. A filter as in claim 1 wherein said average refractive index is periodically varied by varying during deposition the concentration of a higher refractive index dielectric in a sinusoidal manner having a period equal to that desired for said dielectric film.

5. A filter as in claim 3 wherein said film generally comprises $(SiO_2)_x (Ta_2O_5)_{(1-x)}$.

6. A filter as in claim 4 wherein said higher refractive index dielectric is $Ta_2O_5$ and said average refractive index is varied by varying a ratio of $SiO_2$ to $Ta_2O_5$.

7. A filter as in claim 5 wherein said film is deposited by ion-assisted deposition.

8. A filter as in claim 1 wherein an anti-reflection coating is deposited on a side of said filter which is closest to said second order grating.

9. An array of filters for emission at a plurality of discrete wavelengths by an array of surface emitting lasers, each laser having an active region and at least one second order grating for vertical emission adjacent to said active region, said array of filters comprising:
   a plurality of substrates, each substrate being transparent to at least one wavelength of said plurality of discrete wavelengths;
   a dielectric film having an average refractive index deposited on each said substrate, said average refractive index having a periodic variation comprising an alternating higher and lower refractive index, said periodic variation having a period where said desired wavelength is a function of said period, said film having sufficient thickness to cover a plurality of periods to form a plurality of filters, each of which selectively reflects light at a different discrete wavelength;

whereby said plurality of filters is assembled in an array and said array of filters assembled over said array of lasers selectively reflects light of each discrete wavelength corresponding to each filter of said array back into said second order grating of a laser of said array underlying said filter causing said filter to emit light at said discrete wavelength so that each filter and laser combination emits at a different discrete wavelength.

* * * * *